(12) United States Patent
Kobayakawa et al.

(10) Patent No.: US 10,211,179 B2
(45) Date of Patent: Feb. 19, 2019

(54) SEMICONDUCTOR DEVICE

(71) Applicant: ROHM CO., LTD., Kyoto-shi, Kyoto (JP)

(72) Inventors: Masahiko Kobayakawa, Kyoto (JP); Tomoichiro Toyama, Kyoto (JP)

(73) Assignee: ROHM CO., LTD., Kyoto (JP)

(*) Notice: Subject to any disclaimer, the term of this patent is extended or adjusted under 35 U.S.C. 154(b) by 5 days.

(21) Appl. No.: 15/490,458

(22) Filed: Apr. 18, 2017

(65) Prior Publication Data

US 2017/0309592 A1    Oct. 26, 2017

(30) Foreign Application Priority Data

Apr. 20, 2016  (JP) .................................. 2016-084106
Apr. 5, 2017   (JP) .................................. 2017-075123

(51) Int. Cl.
 H01L 23/00  (2006.01)
 H01L 43/04  (2006.01)
 H01L 23/31  (2006.01)

(52) U.S. Cl.
 CPC .............. H01L 24/49 (2013.01); H01L 43/04 (2013.01); H01L 23/3121 (2013.01); H01L 24/45 (2013.01); H01L 24/48 (2013.01); H01L 2224/05554 (2013.01); H01L 2224/32225 (2013.01); H01L 2224/45144 (2013.01); H01L 2224/48091 (2013.01); H01L 2224/48227 (2013.01); H01L 2224/48471 (2013.01); H01L 2224/4905 (2013.01); H01L 2224/73265 (2013.01); H01L 2924/181 (2013.01)

(58) Field of Classification Search
 CPC . H01L 2224/4905; H01L 43/04; H01L 24/49; H01L 27/22; H01L 43/06; H01L 43/065; H01L 43/14
See application file for complete search history.

(56) References Cited

U.S. PATENT DOCUMENTS

| 5,729,437 A    | * | 3/1998 | Hashimoto | H01L 23/3121 174/260 |
| 7,273,765 B2   | * | 9/2007 | Minamio   | H01L 27/14618 257/E21.599 |
| 2002/0020896 A1| * | 2/2002 | Ishikawa  | H01L 23/49805 257/622 |

FOREIGN PATENT DOCUMENTS

JP    2003-249698 A    9/2003

* cited by examiner

*Primary Examiner* — Bilkis Jahan
*Assistant Examiner* — Victor V Barzykin
(74) *Attorney, Agent, or Firm* — Hamre, Schumann, Mueller & Larson, P.C.

(57) ABSTRACT

A semiconductor device includes a base member, a wiring portion, a semiconductor element, and a resin package. The base member has an obverse surface, a reverse surface, and a side surface connecting the obverse surface and the reverse surface. The semiconductor element is electrically connected to the wiring portion and arranged on the obverse surface of the base member. The resin package covers the semiconductor element. The wiring portion includes an obverse-surface portion formed on the obverse surface, a reverse-surface portion formed on the reverse surface, and a through portion connecting the obverse-surface portion and the reverse-surface portion. The through portion has an exposed surface exposed from the side surface of the base member and a larger portion. The larger portion has a dimension larger than the exposed surface in a first direction that is perpendicular to the thickness direction and parallel to the exposed surface.

30 Claims, 12 Drawing Sheets

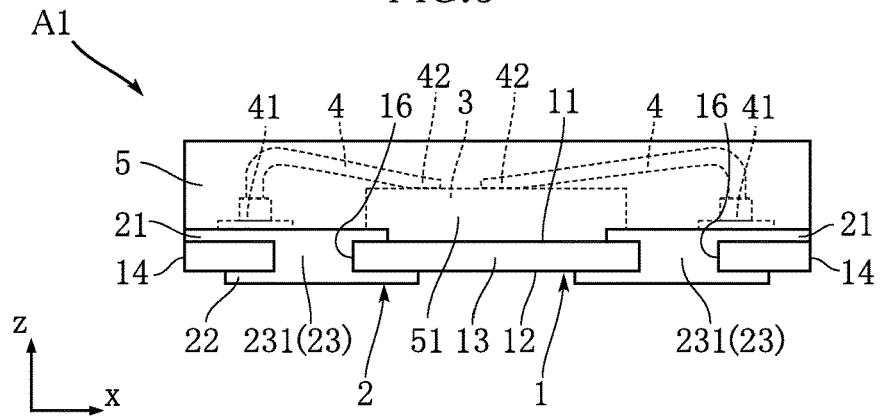
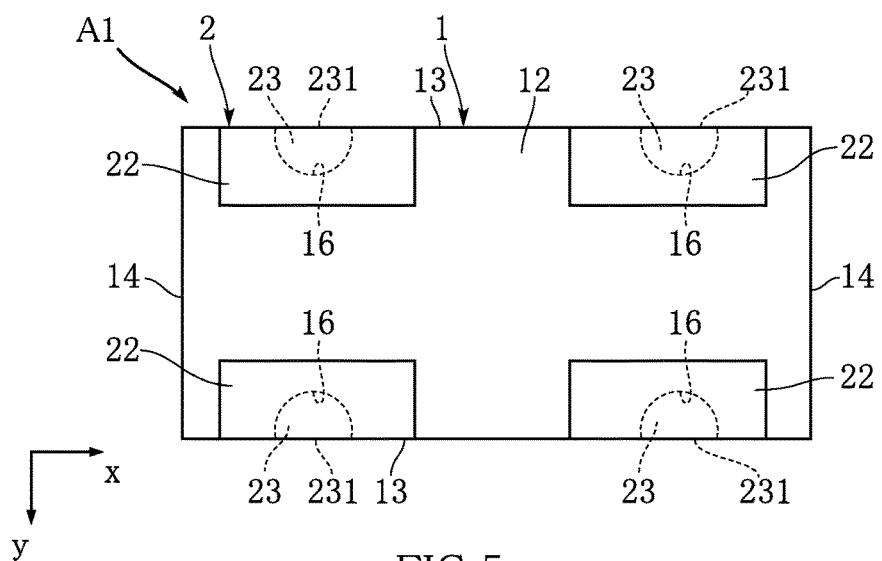
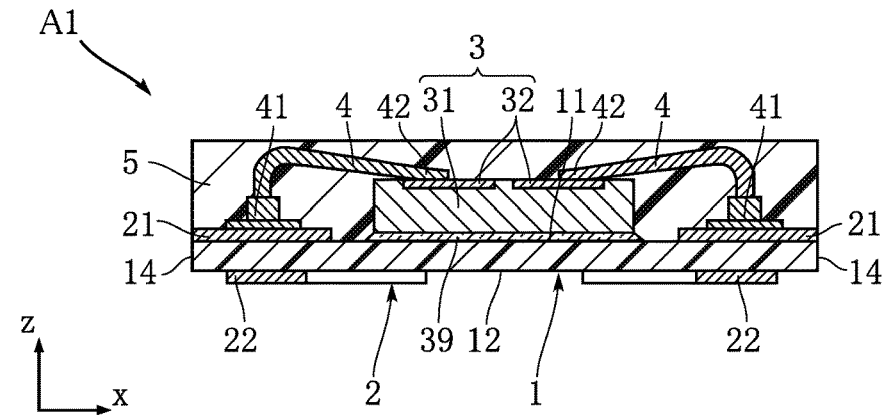

SEMICONDUCTOR DEVICE

FIELD

The present disclosure relates to a semiconductor device.

BACKGROUND

One example of semiconductor devices is a device that includes a Hall element which is a type of semiconductor element. In such a semiconductor device, a Hall element is mounted on an obverse surface of an insulative base member. The base member is formed with a metal wiring portion. The wiring portion has an obverse-surface portion formed on the obverse surface, a reverse-surface portion formed on a reverse surface of the base member, and a through portion connecting the obverse-surface portion and the reverse-surface portion.

The through portion is entirely encompassed by the base member as viewed in the thickness direction of the base member. Accordingly, the dimension of the base member as viewed in the thickness direction needs to be large enough to encompass the through portion. Also, reducing the thickness of the base member to make the semiconductor device thinner may weaken the force of the base member holding the through portion.

SUMMARY

The present disclosure has been proposed under the above circumstances, and a main object thereof is to provide a semiconductor device that can be reduced in size.

The present disclosure provides a semiconductor device. The semiconductor device includes a base member, a wiring portion, a semiconductor element, and a resin package. The base member has an obverse surface, a reverse surface, and a side surface. The obverse surface and the reverse surface face away from each other in a thickness direction. The side surface connects the obverse surface and the reverse surface. The wiring portion is formed on the base member. The semiconductor element is arranged on the obverse surface of the base member and electrically connected to the wiring portion. The resin package covers the semiconductor element. The wiring portion includes an obverse-surface portion formed on the obverse surface, a reverse-surface portion formed on the reverse surface, and a through portion connecting the obverse-surface portion and the reverse-surface portion. The through portion has an exposed surface and a larger portion. The exposed surface is exposed from the side surface of the base member. The larger portion is positioned more inward than the exposed surface as viewed in the thickness direction and has a dimension larger than the exposed surface in a first direction that is perpendicular to the thickness direction and parallel to the exposed surface.

In a preferable embodiment of the present disclosure, the exposed surface crosses the base member in the thickness direction.

In a preferable embodiment of the present disclosure, the exposed surface is rectangular.

In a preferable embodiment of the present disclosure, the exposed surface is flush with the side surface.

In a preferable embodiment of the present disclosure, the resin package has a resin side surface flush with the exposed surface.

In a preferable embodiment of the present disclosure, the base member has a holding part that extends beyond the larger portion and reaches an edge of the exposed surface as viewed in the thickness direction.

In a preferable embodiment of the present disclosure, the through portion has a partially circular shape obtained by cutting, at the exposed surface, a circle whose diameter is the larger portion as viewed in the thickness direction.

In a preferable embodiment of the present disclosure, the obverse-surface portion is larger than the through portion as viewed in the thickness direction.

In a preferable embodiment of the present disclosure, the reverse-surface portion is larger than the through portion as viewed in the thickness direction.

In a preferable embodiment of the present disclosure, the obverse-surface portion reaches the side surface as viewed in the thickness direction.

In a preferable embodiment of the present disclosure, the reverse-surface portion reaches the side surface as viewed in the thickness direction.

In a preferable embodiment of the present disclosure, the wiring portion is not provided between the obverse surface of the base member and the semiconductor element.

In a preferable embodiment of the present disclosure, a distance between the obverse surface of the base member and the semiconductor element in the thickness direction is smaller than a thickness of the obverse-surface portion.

In a preferable embodiment of the present disclosure, the semiconductor device includes a wire bonded to the semiconductor element and the obverse-surface portion.

In a preferable embodiment of the present disclosure, the wire has a bonding portion that is bonded to the obverse-surface portion and that is located at a position retreated from the through portion as viewed in the thickness direction.

In a preferable embodiment of the present disclosure, the bonding portion is a first bonding portion.

In a preferable embodiment of the present disclosure, the bonding portion is positioned farther away from the semiconductor element than the through portion is in the first direction.

In a preferable embodiment of the present disclosure, the semiconductor element is a Hall element.

In a preferable embodiment of the present disclosure, the obverse-surface portion, the reverse-surface portion, and the through portion of the wiring portion are each provided in four in number.

In a preferable embodiment of the present disclosure, the wire is provided in four in number.

In a preferable embodiment of the present disclosure, the side surface of the base member is provided in two in number. The two side surfaces face away from each other. The exposed surfaces of two of the through portions are exposed from one of the side surfaces.

In a preferable embodiment of the present disclosure, the base member has two auxiliary side surfaces connecting the two side surfaces, and is rectangular as viewed in the thickness direction.

In a preferable embodiment of the present disclosure, the obverse-surface portions reach the side surfaces and the auxiliary side surfaces as viewed in the thickness direction.

In a preferable embodiment of the present disclosure, the reverse-surface portions reach the side surfaces and are retreated from the auxiliary side surfaces as viewed in the thickness direction.

In a preferable embodiment of the present disclosure, the Hall element is rectangular as viewed in the thickness direction.

In a preferable embodiment of the present disclosure, the Hall element is oriented such that at least one diagonal line is parallel to either the side surfaces or the auxiliary side surfaces of the base member.

In a preferable embodiment of the present disclosure, the Hall element is oriented such that two diagonal lines are respectively parallel to the side surfaces and the auxiliary side surfaces of the base member.

In a preferable embodiment of the present disclosure, the Hall element has four electrode pads.

In a preferable embodiment of the present disclosure, two of the electrode pads are arranged parallel to the side surfaces.

In a preferable embodiment of the present disclosure, two of the electrode pads are arranged parallel to the auxiliary side surfaces.

In a preferable embodiment of the present disclosure, each of the obverse-surface portions has an inclined side that is parallel to a side of the semiconductor element.

Other features and advantages of the present disclosure will become apparent from the detailed description given below with reference to the accompanying drawings.

BRIEF DESCRIPTION OF THE DRAWINGS

FIG. 3 is a front view showing the semiconductor device according to the first embodiment of the present disclosure;

FIG. 4 is a bottom view showing the semiconductor device according to the first embodiment of the present disclosure;

FIG. 5 is a cross-sectional view taken along line V-V of FIG. 1;

DESCRIPTION OF THE PREFERRED EMBODIMENTS

First Embodiment

A first embodiment of the present disclosure will be described with reference to FIGS. 1 to 8.

Figure 1:
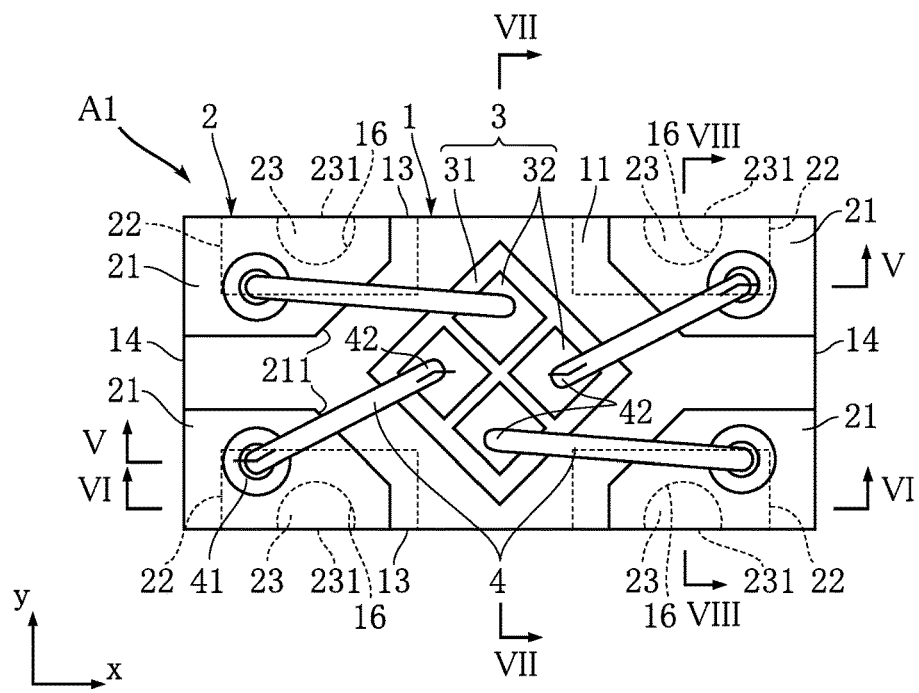
FIG. 1 is a main-part plan view showing a semiconductor device according to a first embodiment of the present disclosure.

FIG. 1 is a main-part plan view showing a semiconductor device according to the first embodiment of the present disclosure.

A semiconductor device A1 shown in FIG. 1 includes a base member 1, a wiring portion 2, a semiconductor element 3, a plurality of wires 4, and a resin package 5.

Figure 2:
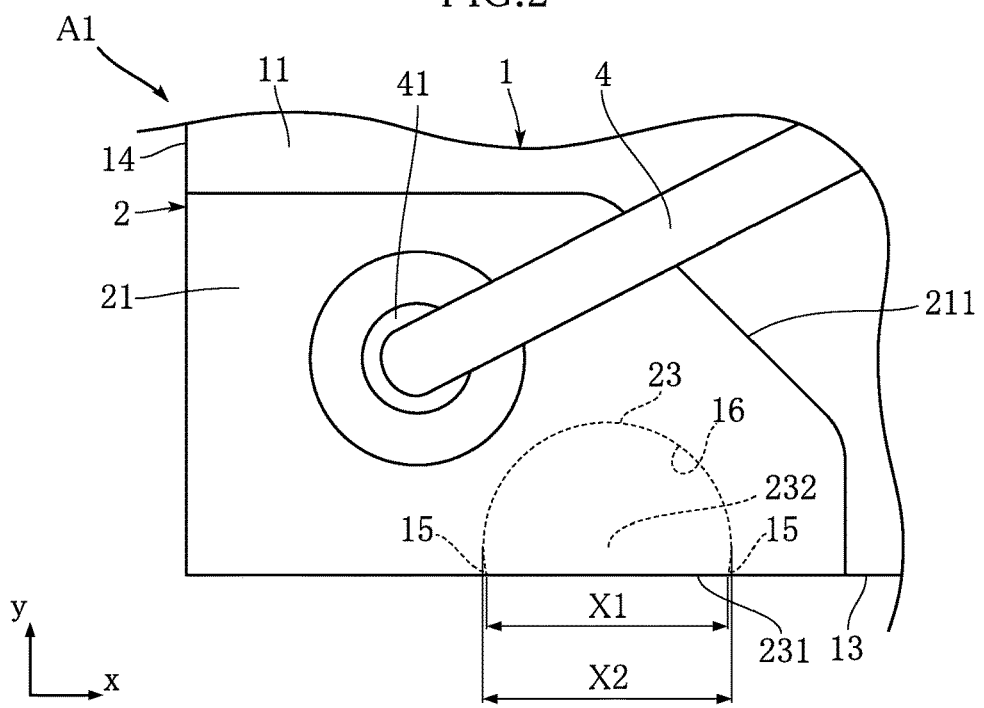
FIG. 2 is a main-part plan view showing the semiconductor device according to the first embodiment of the present disclosure.
Figure 6:
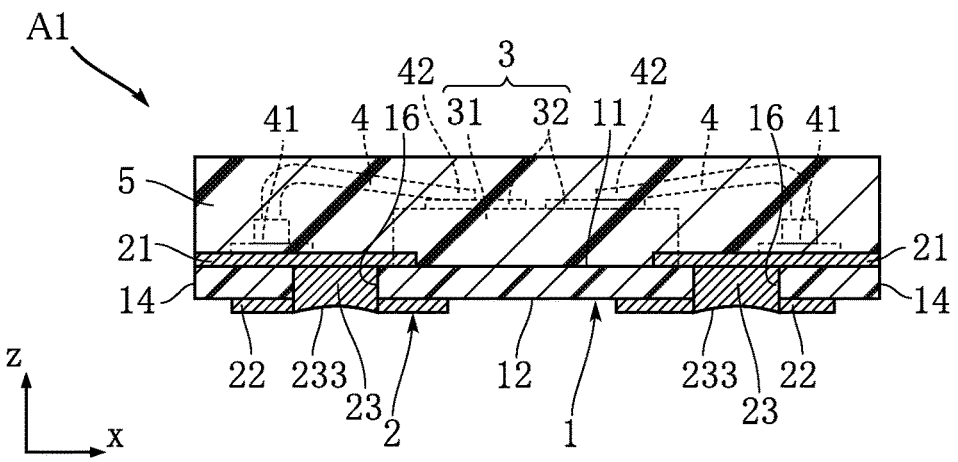
FIG. 6 is a cross-sectional view taken along line VI-VI of FIG. 1.
Figure 7:
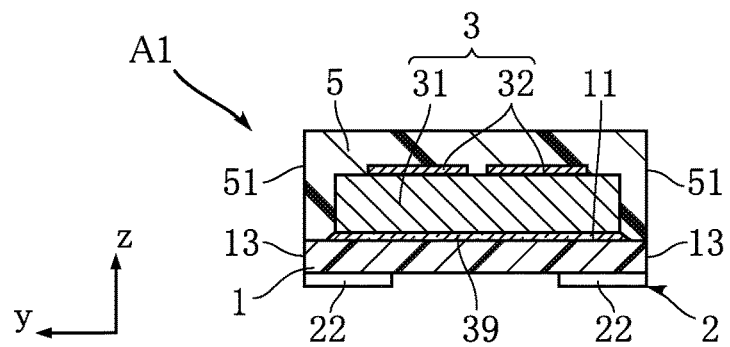
FIG. 7 is a cross-sectional view taken along line VII-VII of FIG. 1.
Figure 8:
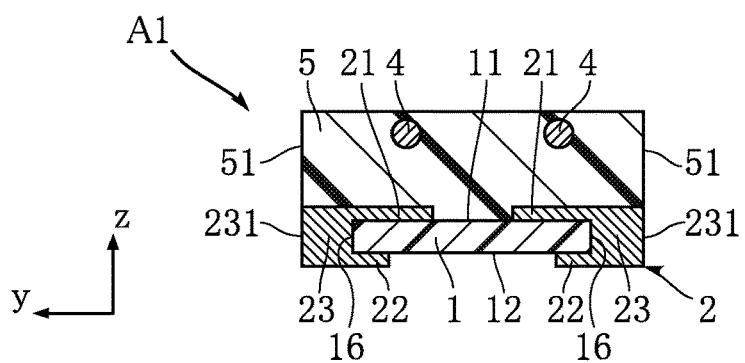
FIG. 8 is a cross-sectional view taken along line VIII-VIII of FIG. 1.

FIG. 2 is a main-part enlarged plan view showing the semiconductor device A1. FIG. 3 is a front view showing the semiconductor device A1. FIG. 4 is a bottom view showing the semiconductor device A1. FIG. 5 is a cross-sectional view taken along line V-V of FIG. 1. FIG. 6 is a cross-sectional view taken along line VI-VI of FIG. 1. FIG. 7 is a cross-sectional view taken along line VII-VII of FIG. 1. FIG. 8 is a cross-sectional view taken along line VIII-VIII of FIG. 1. For the convenience of understanding, FIG. 1 does not show the resin package 5, and the same applies to the other figures including plan views.

For example, the semiconductor device A1 has a dimension of 0.6 mm to 1.0 mm in the x direction, 0.3 mm to 0.5 mm in the y direction, and 0.15 mm to 0.2 mm in the z direction.

The base member 1 is a plate-like member made of an insulative resin such as glass epoxy resin. The base member 1 has a thickness of 0.05 mm to 0.08 mm, for example. As shown in FIG. 1, the base member 1 has a rectangular shape as viewed in the z direction. As shown in FIGS. 1 to 5, the base member 1 has an obverse surface 11, a reverse surface 12, two side surfaces 13, and two auxiliary side surfaces 14. The obverse surface 11 and the reverse surface 12 face away from each other in the z direction. The obverse surface 11 and the reverse surface 12 are flat in the present embodiment. The two side surfaces 13 are perpendicular to the y direction and face away from each other. The two auxiliary side surfaces 14 are perpendicular to the x direction and face away from each other. The base member 1 is provided with a plurality of through portions 16. The through portions 16 may be gaps that penetrate through the base member 1 in the z direction. In the present embodiment, the through portions 16 are cavities open in the y direction as viewed in the z direction. In the illustrated example, each of the through portions 16 has a partially circular shape as viewed in the z direction. In the present example, the base member 1 is provided with four through portions 16.

The wiring portion 2 is provided to electrically connect the semiconductor element 3 to, for example, a wiring pattern of a circuit board (not shown) on which the semiconductor device A1 is to be mounted. The wiring portion 2 is made of a metal conductive material such as Cu. The wiring portion 2 has four obverse-surface portions 21, four reverse-surface portions 22, and four through-connecting portions 23.

As shown in FIGS. 1, 2, and 5, four obverse-surface portions 21 are formed on the obverse surface 11 of the base member 1. In the present embodiment, the obverse-surface portions 21 reach the side surfaces 13 and the auxiliary side surfaces 14 as viewed in the z direction. Each of the obverse-surface portions 21 has an inclined side 211. The inclined side 211 is inclined with respect to both the x direction and the y direction. As shown in FIG. 2, the specific shape of each end of the inclined side 211 may vary depending on certain conditions such as a method for forming the wiring portion 2 or the size of the obverse-surface portions 21. In the semiconductor device A1 having the above-described size, the ends of the inclined side 211 are curved, for example. This also applies to other embodiments and variations.

Four reverse-surface portions 22 are formed on the reverse surface 12 of the base member 1. In the present embodiment, the reverse-surface portions 22 reach the side surfaces 13 and are retreated from the auxiliary side surfaces 14 as viewed in the z direction.

Note that the obverse-surface portions 21 and the reverse-surface portions 22 may be provided with plating layers (not shown). Each of the plating layers may be constituted of a laminate of a Cu plating layer, a Ni plating layer and a Au plating layer, a laminate of a Cu plating layer, a Ni plating layer, a Pd plating layer and a Au plating layer, or a laminate of a Cu plating layer and a Ag plating layer.

As shown in FIGS. 6 and 8, each of the four through-connecting portions 23 extends through the base member 1 in the z direction, and connects the obverse-surface portion 21 and the reverse-surface portion 22. The through-connecting portions 23 are housed in the through portions 16. The through-connecting portions 23 are solid portions not having any through-holes or the like. As shown in FIG. 2, each of the through-connecting portions 23 has an exposed surface 231 and a larger portion 232. The exposed surface 231 is a surface exposed from the side surface 13 of the base member 1. As shown in FIG. 3, the exposed surface 231 crosses the side surface 13 in the z direction. In the present embodiment, the exposed surface 231 is rectangular. As shown in FIG. 2, the exposed surface 231 is a flat surface and is flush with the side surface 13. Also, as shown in FIG. 6, the through-connecting portions 23 have reverse surfaces 233. The reverse surfaces 233 of the through-connecting portions 23 are surfaces exposed from the reverse-surface portions 22 at the side of the reverse surface 12 of the base member 1. In the illustrated example, each of the reverse surfaces 233 has a curved shape recessed upwards in the z direction. The through-connecting portions 23, each of which includes the reverse surface 233 having a curved shape recessed upwards in the z direction (toward the obverse surface 11), may be formed as follows. First, through-spaces in the base member 1 are closed by the obverse-surface portions 21 from the side of the obverse surface 11. Then, with the through-spaces being closed, a plating process is performed to fill the through-spaces. The through-connecting portions 23 having the reverse surfaces 233 as described above are advantageous in increasing soldering area when the semiconductor device A1 is mounted on a circuit board (not shown).

As shown in FIG. 2, the larger portion 232 of the through-connecting portion 23 is positioned more inward than the exposed surface 231 as viewed in the z direction. A dimension X2 (dimension in the x direction) of the larger portion 232 is larger than a dimension X1 (dimension in the x direction) of the exposed surface 231. In the present embodiment, each of the through-connecting portions 23 has a partially circular shape as viewed in the z direction. This shape is obtained by cutting, at the exposed surface (i.e., a surface away from the center of the circle), a circle whose diameter is the larger portion 232.

The aforementioned plating layers are provided for both the obverse-surface portions 21 and the reverse-surface portions 22, but may not be provided for the exposed surfaces 231.

In connection with the structure where each of the through-connecting portions 23 has the exposed surface 231 and the larger portion 232, the base member 1 has holders 15, as shown in FIG. 2. As viewed in the z direction, each of the holders 15 extends beyond the larger portion 232 and reaches an edge of the exposed surface 231 in the x direction. In the present embodiment, two holders 15 are provided, one at each side of one through-connecting portion 23 in the x direction.

In the present embodiment, the obverse-surface portions 21 are larger than the through-connecting portions 23 as viewed in the z direction, as shown in FIGS. 1 and 2. In addition, the reverse-surface portions 22 are larger than the through-connecting portions 23 as viewed in the z direction.

The semiconductor element 3 is a functional element in the semiconductor device A1, and is a Hall element in the present embodiment. In other words, the semiconductor element 3 can detect an external magnetic field by taking advantage of the Hall effect. The semiconductor device A1 including the semiconductor element 3 as described above is used to detect the position of a magnetic object, for example.

As shown in FIG. 1, the semiconductor element 3 has an element body 31 and four electrode pads 32. The element body 31 is made of a semiconductor material and exhibits the Hall effect. The four electrode pads 32 are made up of two electrode pads 32 for inputting the control current to the semiconductor element 3, and two electrode pads 32 for outputting the output voltage (Hall voltage).

In the present embodiment, the semiconductor element 3 is rectangular as viewed in the z direction. The length of a side of the semiconductor element 3 is 0.2 mm to 0.3 mm, for example. Also, one of the diagonal lines of the semiconductor element 3 is parallel to the x direction (side surfaces 13), and the other diagonal line is parallel to the y direction (auxiliary side surfaces 14). Two electrode pads 32 are arranged parallel to the x direction (side surfaces 13), and the other two electrode pads 32 are arranged parallel to the y direction (auxiliary side surfaces 14).

The semiconductor element 3 is mounted on the obverse surface 11. In the present embodiment, the semiconductor element 3 is directly bonded to the obverse surface 11 by a bonding material 39, without intervention of the wiring portion 2, as shown in FIG. 5. The bonding material 39 that can bond the semiconductor element 3 to the obverse surface 11 of the base member 1 is not particularly limited, and the bonding material 39 may be selected appropriately from materials such as conductive bonding materials and insulating bonding materials. In the illustrative example, an insulating bonding material, such as thermosetting resin or ultraviolet curing resin, is selected as the bonding material 39. As one specific example, the bonding material 39 is epoxy resin. Alternatively, if a conductive bonding material is selected as the bonding material 39, the material may be a conductive paste including Ag, for example. In this way, the distance between the obverse surface 11 and the semiconductor element 3 in the z direction is smaller than the thickness of the obverse-surface portions 21. Unlike the present embodiment, it is possible to provide a part of the wiring portion 2 or a layer other than the wiring portion 2, such as a Cu layer, between the obverse surface 11 and the semiconductor element 3.

The wires 4 electrically connect the wiring portion 2 and the semiconductor element 3. In the present embodiment, four wires 4 are provided. Each of the wires 4 is bonded to the corresponding electrode pad 32 of the semiconductor element 3 and the corresponding obverse-surface portion 21 of the wiring portion 2. The wires 4 are made of Au, for example.

In the present embodiment, the wires 4 have first bonding portions 41 and second bonding portions 42. The first bonding portions 41 are bonded to the obverse-surface portions 21. The second bonding portions 42 are bonded to the electrode pads 32 of the semiconductor element 3. As shown in FIGS. 1 and 2, the first bonding portions 41 are provided at the positions avoiding the through-connecting portions 23. In the x direction, the first bonding portions 41 are positioned farther away from the semiconductor element 3 than the through-connecting portions 23 are. In the y direction, the first bonding portions 41 are positioned closer to the center of the semiconductor element 3 than the through-connecting portions 23 are.

The resin package 5 covers the semiconductor element 3 at the side of the obverse surface 11. The resin package 5 is made of an insulative resin such as epoxy resin mixed with a filler. The resin package 5 has two resin side surfaces 51 as shown in FIGS. 7 and 8. The resin side surfaces 51 are flush with the side surfaces 13 and the exposed surfaces 231.

Figure 9:
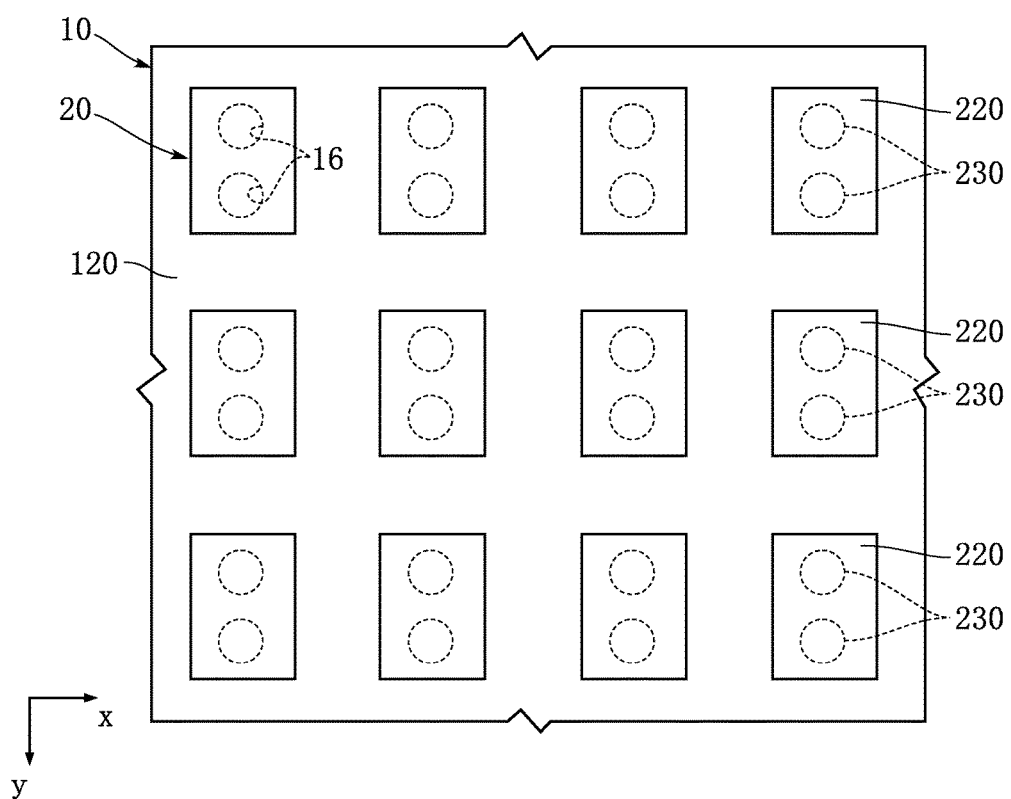
FIG. 9 is a main-part plan view showing a method for manufacturing the semiconductor device according to the first embodiment of the present disclosure.
Figure 10:
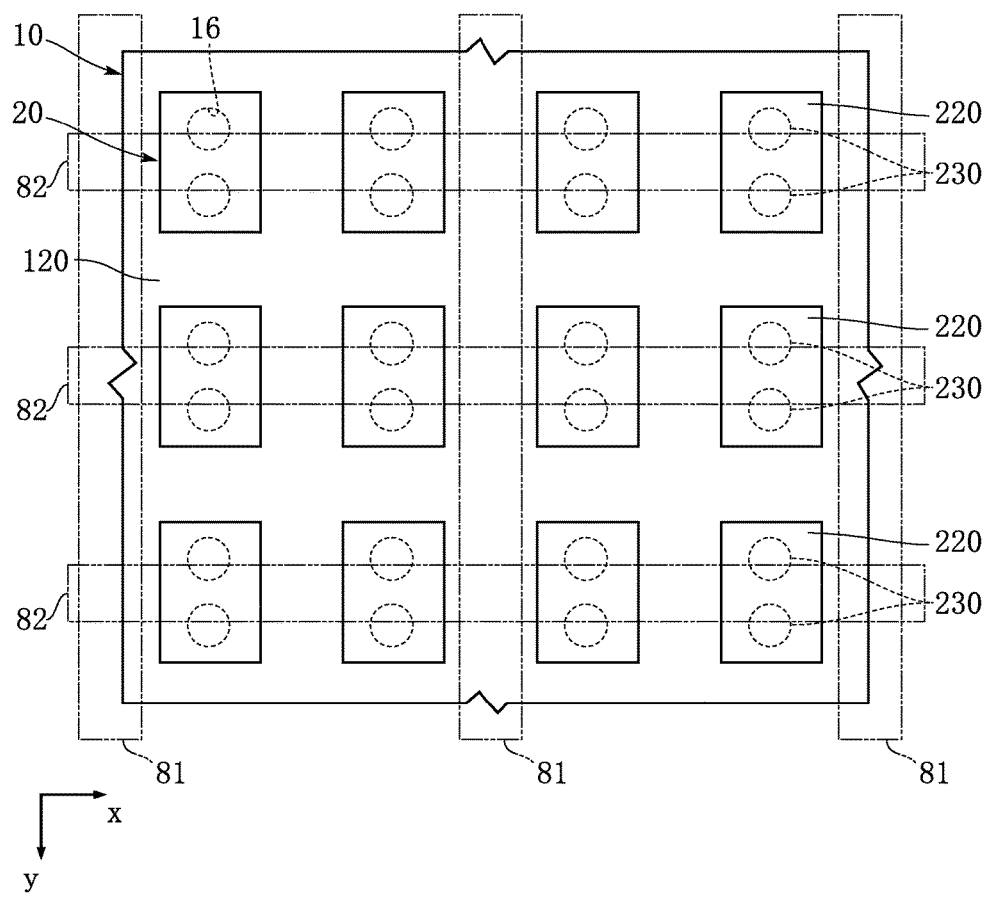
FIG. 10 is a main-part plan view showing the method for manufacturing the semiconductor device according to the first embodiment of the present disclosure.
Figure 11:
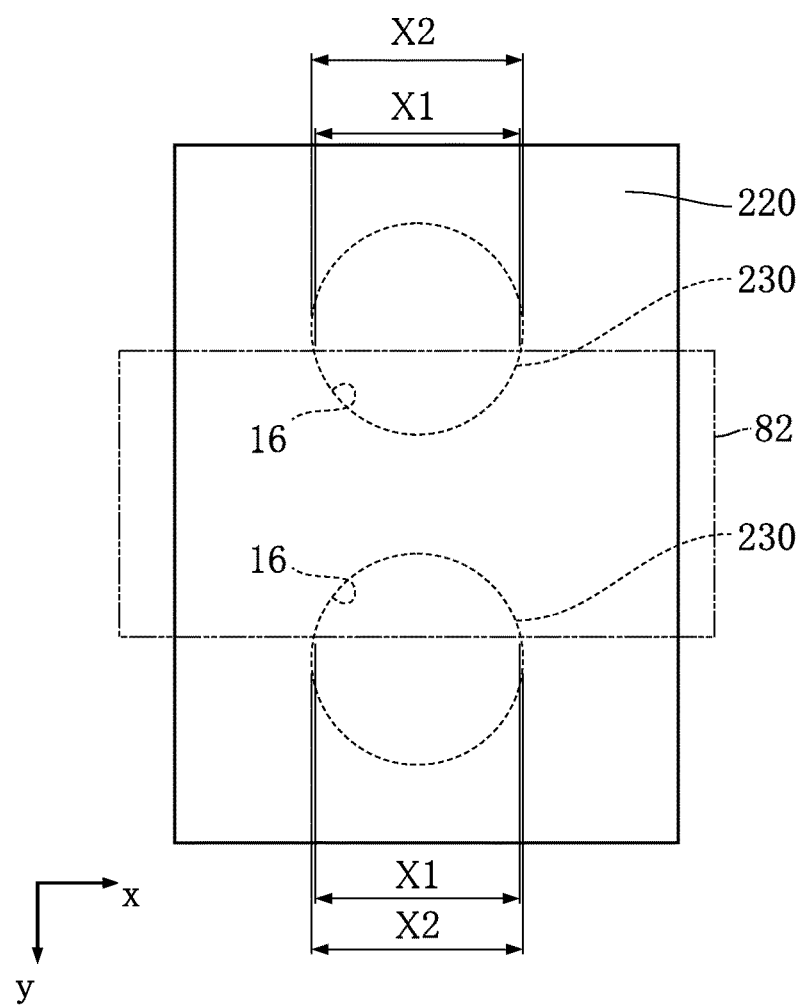
FIG. 11 is a main-part enlarged plan view showing the method for manufacturing the semiconductor device according to the first embodiment of the present disclosure.

FIGS. 9 to 11 show an example of a method for manufacturing the semiconductor device A1.

FIG. 9 is a bottom view showing a step of the method for manufacturing the semiconductor device A1. In the illustrated step, a base member material 10 is prepared from which a plurality of base members 1 can be formed. The base member material 10 is formed with a plurality of through portions 16 and conductive portions 20. The plurality of through portions 16 are through-holes that penetrate through the base member material 10. The conductive portions 20 have a plurality of obverse-surface portions, reverse-surface portions 220, and through-connecting portions 230. The obverse-surface portions are formed on an obverse surface of the base member material 10, and the reverse-surface portions 220 are formed on a reverse surface 120 of the base member material 10. The through-connecting portions 230 penetrate through the base member material 10, are housed in the through portions 16, and connect the obverse-surface portions and the reverse-surface portions 220. In the illustrated example, the through-connecting portions 230 are circular as viewed in the z direction. Also, each of the obverse-surface portions is connected to a different one of the reverse-surface portions 220 by means of two through-connecting portions 230. The conductive portions 20 are provided by laminating a Cu plating layer on the base member material 10 having through-holes thereon for forming the through-connecting portions 230.

To improve the manufacturing efficiency, it is preferable to complete the steps of mounting the semiconductor element 3 on the base member material 10, bonding the wires 4, and forming the resin package 5, prior to the steps shown in FIGS. 10 and 11.

Next, as shown in FIGS. 10 and 11, the base member material 10 and the conductive portions 20 are cut in cut areas 81 and cut areas 82. The cutting may be performed with a dicing blade. The cutting removes parts of the base member material 10 and the conductive portions 20 that exist in the cut areas 81 and the cut areas 82. The cut areas 81 are removed by the cutting along the y direction, and the cut areas 82 are removed by the cutting along the x direction.

As shown in FIG. 11, the cut area 82 is deviated from the centers of the circular through-connecting portions 230 in the y direction, as viewed in the z direction. In other words, a part including the center of any of the through-connecting portions 23 has a dimension X2 in the x direction, while a part overlapping an outer edge of the cut area 82 has a dimension X1 in the x direction, which is smaller than the dimension X2.

Through the process of cutting in the cut areas 81 and the cut areas 82, the base member material 10 is divided into a plurality of base members 1 and the conductive portions 20 function as the wiring portions 2. As a result, a plurality of semiconductor devices A1 are obtained.

The following describes advantages of the semiconductor device A1.

According to the present embodiment, the through-connecting portions 23 have the exposed surfaces 231 that are exposed from the side surfaces 13 of the base member 1, and are not entirely housed in the base member 1 as viewed in the z direction. Accordingly, the base member 1 can have a reduced dimension as viewed in the z direction, as compared to the structure where the through-connecting portions 23 are entirely housed as viewed in the z direction. In addition, the through-connecting portions 23 have the larger portions 232 which are larger than the exposed surfaces 231 in the x direction. This allows the larger portions 232 to be engaged with the base member 1 as viewed in the z direction, thereby enhancing the holding force of the base member 1 with respect to the through-connecting portions 23. This will compensate the reduction in the holding force with respect to the through-connecting portions 23 due to thinning of the base member 1. As a result, the semiconductor device A1 can be downsized.

The exposed surfaces 231 are flush with the side surfaces 13, or in other words, the exposed surfaces 231 do not protrude from the side surfaces 13. This can prevent the through-connecting portions 23 from being subjected to an unintentional external force.

The base member 1 has the holders 15 that sandwich each of the through-connecting portions 23 from opposite ends in the x direction. The holders 15 can prevent the through-connecting portions 23 from slipping out of the base member 1 in the y direction.

The through-connecting portions 23 shown in FIG. 2 are formed by cutting portions of the circular through-connecting portions 230 as shown in FIGS. 10 and 11. It is relatively easy to form, in the base member material 10, through-holes for housing the circular through-connecting portions 230. Therefore, such formation is suitable for improving the manufacturing efficiency.

Since the wiring portion 2 is not provided between the obverse surface 11 and the semiconductor element 3, the distance between the obverse surface 11 and the semiconductor element 3 in the z direction is smaller than the thickness of the obverse-surface portions 21. This is suitable for reducing the dimension of the semiconductor device A1 in the z direction.

The obverse-surface portions 21 are positioned closer to the obverse surface 11 than the electrode pads 32 of the semiconductor element 3 are. Forming the first bonding portions 41 on these obverse-surface portions 21 can reduce the dimension of the semiconductor device A1 in the z direction.

Since the first bonding portions 41 are provided at the positions retreated from the through-connecting portions 23 as viewed in the z direction, the through-connecting portions 23 will not be affected by the force generated during the formation of the first bonding portions 41.

The first bonding portions 41 are positioned farther away from the semiconductor element 3 than the through-connecting portions 23 are in the x direction, and such a structure can prevent the length of the wires 4 from being too short. This is suitable to appropriately bond the wires 4.

The two diagonal lines of the semiconductor element 3 are parallel to the x direction and the y direction. In addition, the obverse-surface portions 21 have inclined sides 211 which are formed to be parallel to the sides of the semiconductor element 3. This can properly avoid the interference between the semiconductor element 3 and the obverse-surface portions 21 and prevent creation of excess space on the obverse surface 11, which is preferable for downsizing the semiconductor device A1.

Two electrode pads 32 are aligned in the x direction, and another two electrode pads 32 are aligned in the y direction. This can prevent unreasonable reduction in the area of the four electrode pads 32 on the semiconductor element 3.

According to the present embodiment, the through-connecting portions 23 have the exposed surfaces 231 that are exposed from the side surfaces 13 of the base member 1, and are not entirely housed in the base member 1 as viewed in the z direction. Accordingly, the base member 1 can have a reduced dimension as viewed in the z direction, as compared to the structure where the through-connecting portions 23 are entirely housed as viewed in the z direction. In addition, the through-connecting portions 23 have the larger portions 232 which are larger than the exposed surfaces 231 in the x direction. This allows the larger portions 232 to be engaged with the base member 1 as viewed in the z direction, thereby enhancing the holding force of the base member 1 with respect to the through-connecting portions 23. This will compensate the reduction in the holding force with respect to the through-connecting portions 23 due to thinning of the base member 1. As a result, the semiconductor device A1 can be downsized.

First Variation of First Embodiment

Figure 12:
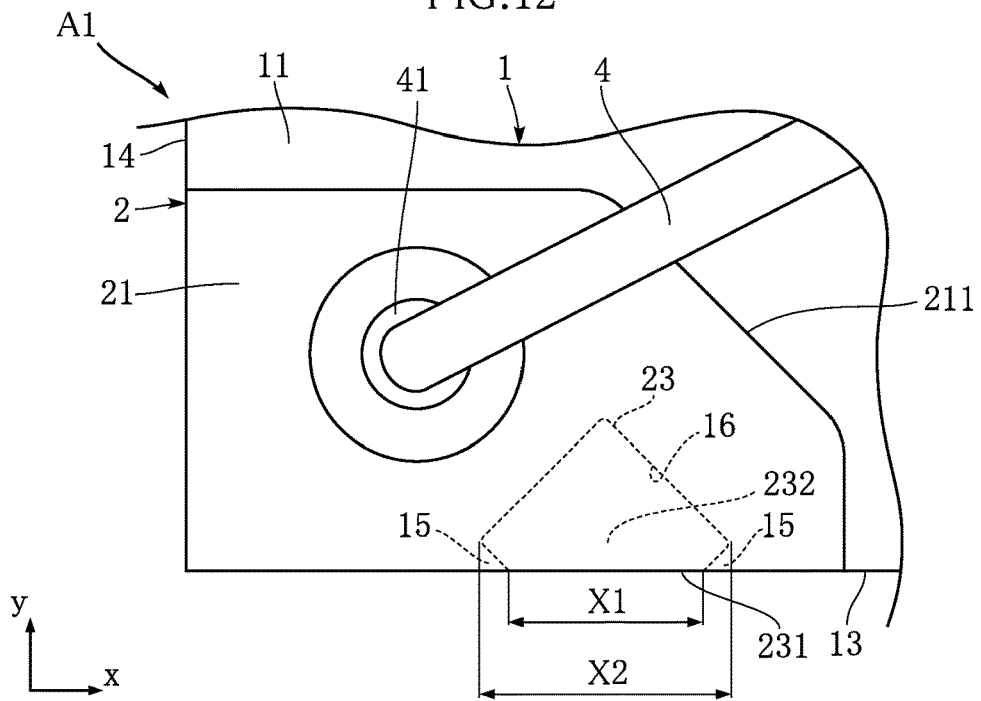
FIG. 12 is a main-part enlarged plan view showing a semiconductor device according to a first variation of the first embodiment of the present disclosure.

The following describes a first variation of the first embodiment of the present disclosure with reference to FIG. 12.

FIG. 12 is a main-part enlarged plan view showing a semiconductor device according to a first variation of the first embodiment of the present disclosure.

In the following descriptions, the structures that are identical or similar to the above are provided with the same reference signs as above, and descriptions thereof are omitted appropriately.

Regarding a semiconductor device A1 in FIG. 12, a through portion 16 and a through-connecting portion 23 are pentagonal as viewed in z direction. The portion including two corners and positioned close to the center of the through-connecting portion 23 in the y direction is a larger portion 232 having a dimension X2 in the x direction. A dimension X1, which is the dimension of an exposed surface 231 in the x direction, is smaller than the dimension X2. The through-connecting portion 23 as described above is formed by cutting a through-connecting portion 230 that has a rhombic shape as viewed in the z direction, during the steps shown in FIGS. 10 and 11.

Second Variation of First Embodiment

Figure 13:
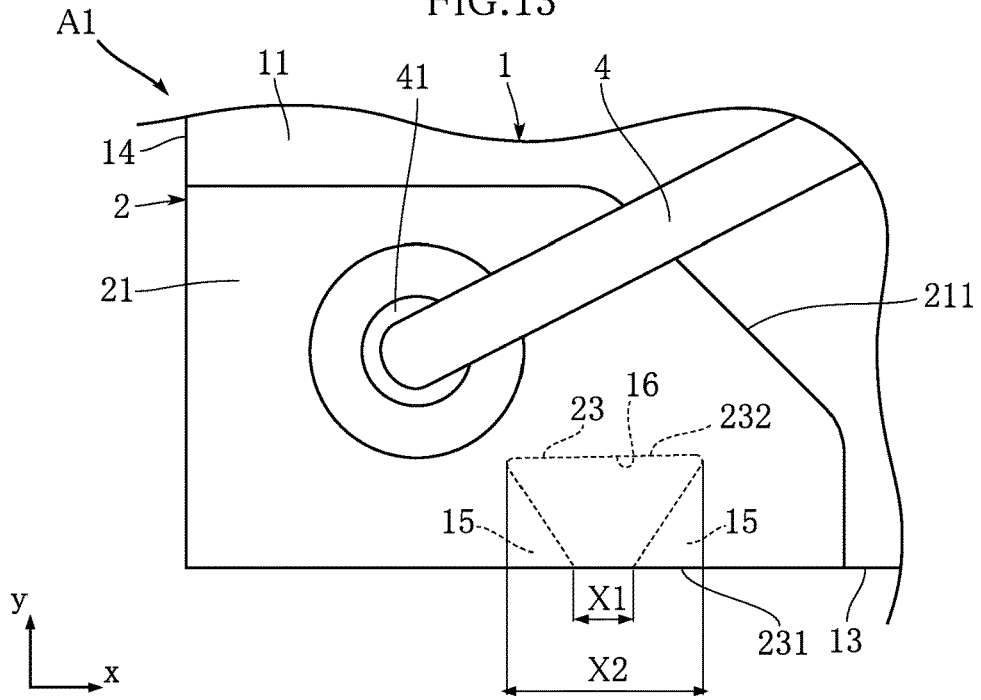
FIG. 13 is a main-part enlarged plan view showing a semiconductor device according to a second variation of the first embodiment of the present disclosure.

The following describes a second variation of the first embodiment of the present disclosure with reference to FIG. 13.

FIG. 13 is a main-part enlarged plan view showing a semiconductor device according to a second variation of the first embodiment of the present disclosure.

Regarding a semiconductor device A1 in FIG. 13, a through portion 16 and a through-connecting portion 23 are trapezoidal as viewed in z direction. The portion that includes the lower base (the longer of the two parallel sides) of the through-connecting portion 23 is a larger portion 232 having a dimension X2 in the x direction. An exposed surface 231 corresponds to the upper base (the shorter of the two parallel sides) of the through-connecting portion 23, and has a dimension X1 that is a dimension in the x direction and smaller than the dimension X2. The through-connecting portion 23 as described above is formed by cutting a through-connecting portion 230 that has a triangular shape as viewed in the z direction, during the steps shown in FIGS. 10 and 11.

Third Variation of First Embodiment

Figure 14:
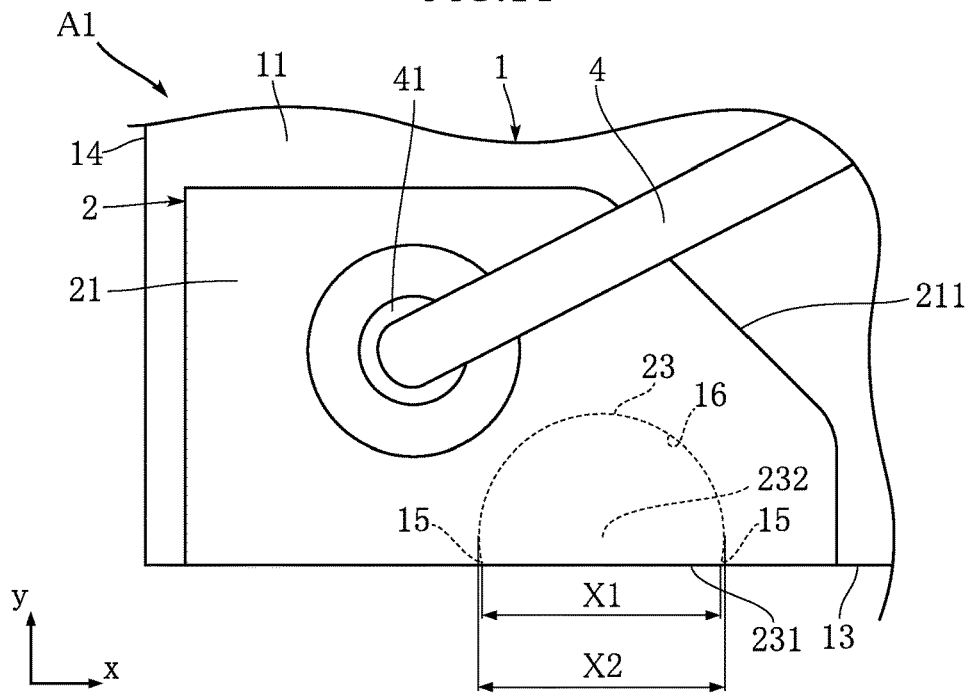
FIG. 14 is a main-part enlarged plan view showing a semiconductor device according to a third variation of the first embodiment of the present disclosure.

The following describes a third variation of the first embodiment of the present disclosure with reference to FIG. 14.

FIG. 14 is a main-part enlarged plan view showing a semiconductor device according to a third variation of the first embodiment of the present disclosure.

A semiconductor device A1 shown in FIG. 14 differs from the above examples in terms of the arrangement of obverse-surface portions 21 on an obverse surface 11.

The obverse-surface portions 21 according to the present variation reach side surfaces 13 of a base member 1 as viewed in the z direction but do not reach auxiliary side surfaces 14 of the base member 1. That is, the obverse-surface portions 21 are spaced apart from the auxiliary side surfaces 14 of the base member 1. In this way, the obverse-surface portions 21 may be spaced apart from the auxiliary side surfaces 14 when exposed surfaces 231 are exposed at the side surfaces 13. Alternatively, the obverse-surface portions 21 may be spaced apart from the side surfaces 13 when the exposed surfaces 231 are exposed at the auxiliary side surfaces 14, as described in the example below.

Second Embodiment

A second embodiment of the present disclosure will be described with reference to FIG. 15.

Figure 15:
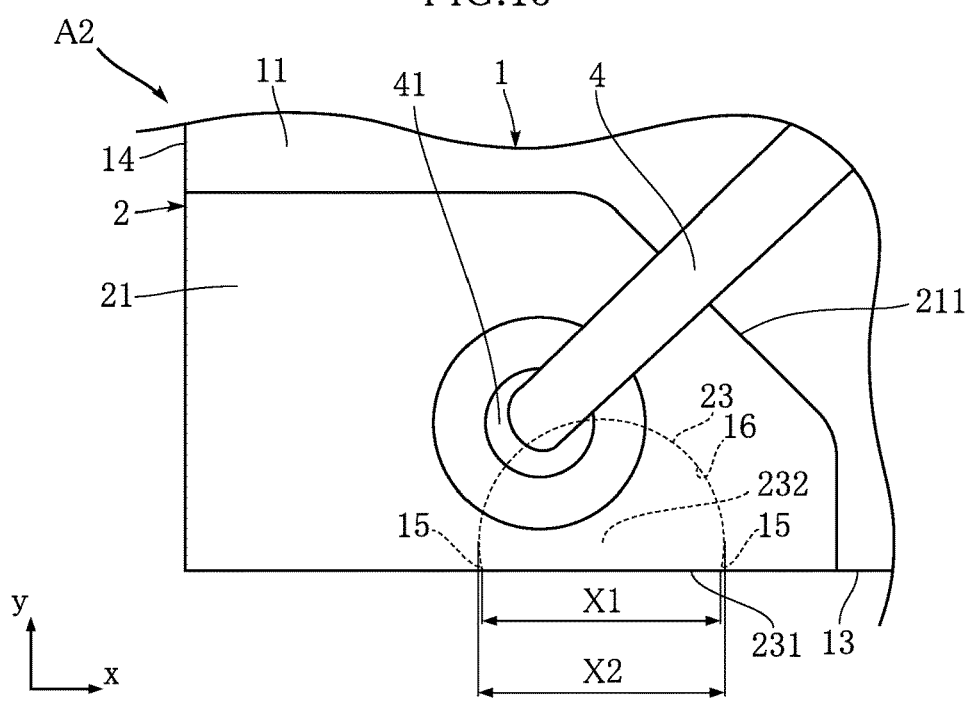
FIG. 15 is a main-part enlarged plan view showing a semiconductor device according to a second embodiment of the present disclosure.

FIG. 15 is a main-part enlarged plan view showing a semiconductor device according to a second embodiment of the present disclosure.

A semiconductor device A2 shown in FIG. 15 differs from that in the above embodiment in terms of the positional relationship between first bonding portions 41 of wires 4 and through-connecting portions 23.

In the present embodiment, the first bonding portions 41 of the wires 4 overlap with the through-connecting portions 23 as viewed in the z direction. In the illustrated example, a part of the first bonding portion 41 overlaps with a part of the through-connecting portion 23. Alternatively, the entirety of one of the first bonding portion 41 and the through-connecting portion 23 may overlap with a part of the other one of the two. Yet alternatively, the first bonding portion 41 and the through-connecting portion 23 may entirely overlap with each other.

Such an embodiment can also downsize the semiconductor device A2. In addition, overlapping at least parts of the first bonding portions 41 with at least parts of the through-connecting portions 23 enables the centers of the first bonding portions 41 to be brought closer to the centers of the through-connecting portions 23 as viewed in the z direction. This makes it possible to reduce the area of at least either the obverse-surface portions 21 or the reverse-surface portions 22. Such a structure is preferable in downsizing the semiconductor device A2.

Third Embodiment

A third embodiment of the present disclosure will be described with reference to FIG. 16.

Figure 16:
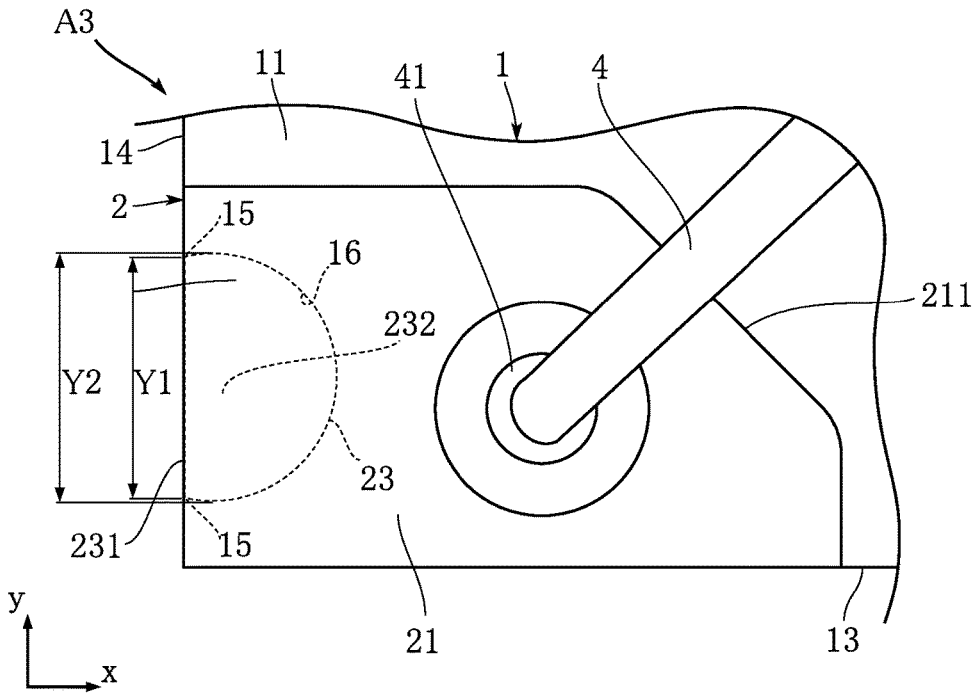
FIG. 16 is a main-part enlarged plan view showing a semiconductor device according to a third embodiment of the present disclosure.

FIG. 16 is a main-part enlarged plan view showing a semiconductor device according to a third embodiment of the present disclosure.

A semiconductor device A3 shown in FIG. 16 differs from those described in the above embodiments in terms of the structures of through portions 16 and through-connecting portions 23.

In the present embodiment, the through portions 16 are open in the x direction. Exposed surfaces 231 are surfaces exposed from auxiliary side surfaces 14 of a base member 1. The exposed surfaces 231 cross the auxiliary side surfaces 14 in the z direction. In the present embodiment, the exposed surfaces 231 are rectangular. Also, the exposed surfaces 231 are flat surfaces and are flush with the auxiliary side surfaces 14.

Each of the larger portions 232 is positioned more inward than the exposed surfaces 231 as viewed in the z direction, and has a dimension Y2 that is a dimension in the y direction and larger than the dimension Y1. In the present embodiment, each of the through-connecting portions 23 has a shape obtained by cutting, at the exposed surface 231, a circle whose diameter is the larger portion 232 as viewed in the z direction.

In connection with each through-connecting portion 23 having the exposed surface 231 and the larger portion 232, the base member 1 has holders 15 that each extend beyond the larger portion 232 and reach an edge of the exposed surface 231 in the y direction as viewed in the z direction. In the present embodiment, two holders 15 are provided, one at each side of one through-connecting portion 23 in the y direction.

Such an embodiment can also downsize the semiconductor device A3. In addition, forming the through-connecting portions 23 such that the exposed surfaces 231 expose from the auxiliary side surfaces 14 enables reduction in the dimension of the semiconductor device A3 in the y direction.

Fourth Embodiment

A fourth embodiment of the present disclosure will be described with reference to FIGS. 17 and 18.

Figure 17:
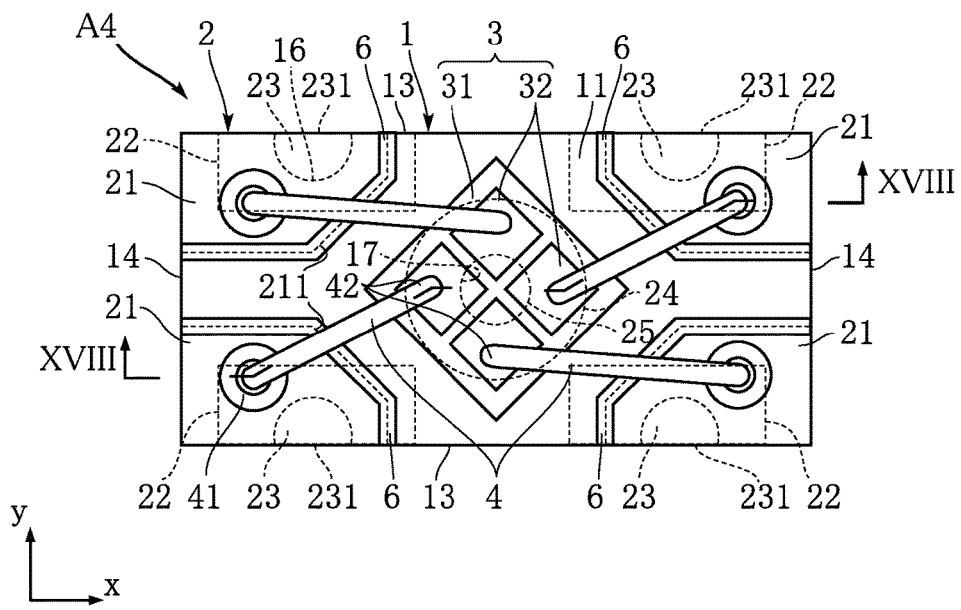
FIG. 17 is a plan view showing a semiconductor device according to a fourth embodiment of the present disclosure.

FIG. 17 is a plan view showing a semiconductor device according to a fourth embodiment of the present disclosure. FIG. 18 is a cross-sectional view taken along line XVIII-XVIII of FIG. 17.

Figure 18:
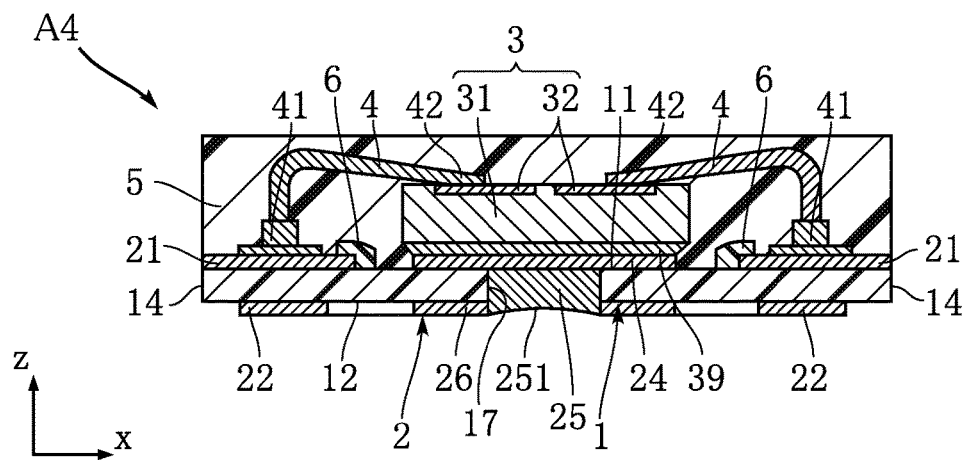
FIG. 18 is a cross-sectional view taken along line XVIII-XVIII of FIG. 17.

A semiconductor device A4 shown in FIGS. 17 and 18 differs from those in the above embodiments chiefly in terms of the structures of a base member 1 and a wiring portion 2.

In the present embodiment, the base member 1 has a through portion 17. The through portion 17 is a through-hole that penetrates through the base member 1 in the z direction. The through portion 17 is provided substantially at the center of the base member 1 in the illustrated example. The wiring portion 2 has an element mounting portion 24, a through portion 25, and a reverse-surface portion 26. The element mounting portion 24 is formed on an obverse surface 11 of the base member 1. As shown in FIG. 17, the element mounting portion 24 is spaced apart from four obverse-surface portions 21 as viewed in plan view. The element mounting portion 24 is a portion on which a semiconductor element 3 is mounted. In the illustrated example, the element mounting portion 24 is encompassed by the semiconductor element 3 as viewed in the z direction. Note that the element mounting portion 24 may partially stick out of the semiconductor element 3. The semiconductor element 3 is bonded to the element mounting portion 24 with a bonding material 39. In the illustrated example, the bonding material 39 is a conductive bonding material such as a conductive paste containing Ag.

The reverse-surface portion 26 is a portion formed on a reverse surface 12 of the base member 1. The reverse-surface portion 26 may be spaced apart from four reverse-surface portions 22 or may be connected to one of the four reverse-surface portions 22.

The through portion 25 penetrates through the base member 1, is housed in a through portion 16, and at least partially overlaps with the element mounting portion 24 as viewed in the z direction. In the illustrated example, the through portion 25 is entirely encompassed by the element mounting portion 24 as viewed in the z direction. The through portion 25 is connected to the element mounting portion 24 and the reverse-surface portion 26.

The through portion 25 has a reverse surface 251. The reverse surface 251 of the through portion 25 is a surface exposed from the reverse-surface portion 26 at the side of the reverse surface 12 of the base member 1. In the illustrated example, the reverse surface 251 has a curved shape recessed upwards in the z direction. The through portion 25, which includes the reverse surface 251 having a curved shape recessed upwards in the z direction (toward the obverse surface 11), may be formed as follows. First, a through-space in the base member 1 is closed by the element mounting portion 24 from the side of the obverse surface 11. Then, with the through-space being closed, a plating process is performed to fill the through-space.

In the present embodiment, the semiconductor device A4 includes a resist layer 6. The resist layer 6 is made of an insulative resin or the like, and has a thickness of 20 μm, for example. The resist layer 6 covers some of the edges of the obverse-surface portions 21 that are positioned more inward than side surfaces 13 and auxiliary side surfaces 14. In other words, the resist layer 6 covers at least inclined sides 211 of the obverse-surface portions 21.

Such an embodiment can also downsize the semiconductor device A4. In addition, the semiconductor element 3 is bonded to the element mounting portion 24. The element mounting portion 24 is connected to the reverse-surface portion 26 via the through portion 25. Accordingly, the reverse surface 251 of the through portion 25 and the reverse-surface portion 26 can be bonded, for example by soldering, to a wiring pattern or the like of a circuit board (not shown) on which the semiconductor device A4 is to be mounted, whereby heat generated from the semiconductor element 3 can be efficiently conducted by the circuit board. This make it possible to promote heat dissipation from the semiconductor element 3. The through portion 25 has the reverse surface 251 having a recessed shape, which is advantageous in increasing a solder-bonding area.

The structure in which the bonding material 39 is a conductive bonding material is preferable in promoting heat dissipation from the semiconductor element 3. In addition, provision of the resist layer 6 can prevent the bonding material 39, which is a conductive bonding material, from unintentionally adhered to the obverse-surface portions 21.

Fifth Embodiment

A fifth embodiment of the present disclosure will be described with reference to FIG. 19.

Figure 19:
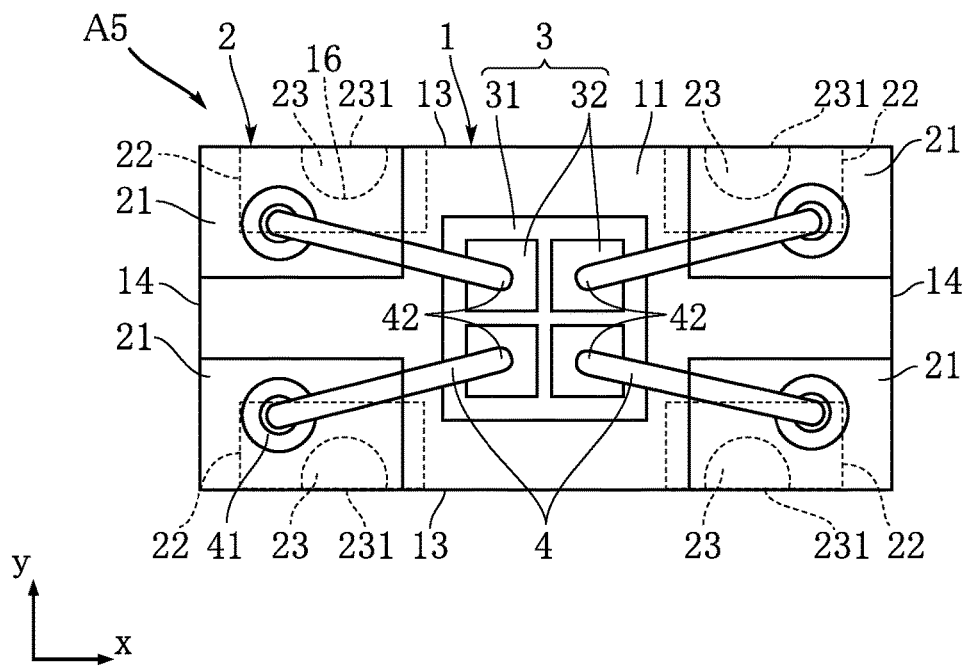
FIG. 19 is a plan view showing a semiconductor device according to a fifth embodiment of the present disclosure.

FIG. 19 is a plan view showing a semiconductor device according to a fifth embodiment of the present disclosure.

A semiconductor device A5 shown in FIG. 19 differs from those in the above embodiments chiefly in terms of the arrangement of a semiconductor element 3.

In the present embodiment, two sides of the semiconductor element 3 having a rectangular shape are parallel to the x direction, and the other two sides are parallel to the y direction. Each of two diagonal lines of the semiconductor element 3 crosses the x direction (side surface 13) and the y direction (auxiliary side surface 14). Regarding four electrode pads 32, two sides of each of the electrode pads are parallel to the x direction, and the other two sides are parallel to the y direction.

In the illustrated example, obverse surface portions 21 are rectangular as viewed in the z direction. However, the obverse surface portions 21 may have a different shape such as a shape having an inclined surface 211 as described in the above embodiments.

Such an embodiment can also downsize the semiconductor device A5.

Sixth Embodiment

A sixth embodiment of the present disclosure will be described with reference to FIG. 20.

Figure 20:
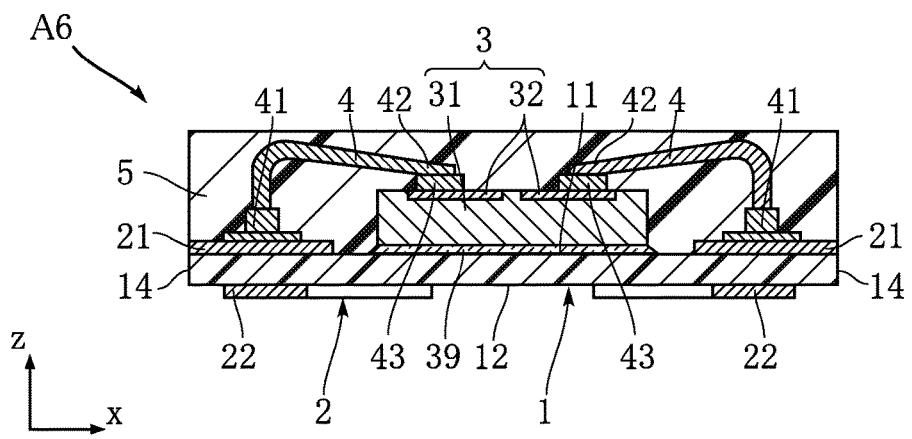
FIG. 20 is a cross-sectional view showing a semiconductor device according to a sixth embodiment of the present disclosure.

FIG. 20 is a cross-sectional view showing a semiconductor device according to the sixth embodiment of the present disclosure.

A semiconductor device A6 shown in FIG. 20 differs from those described in the above embodiments in terms of the structure of wires 4.

Each of the wires 4 of the present embodiment has a first bonding portion 41, a second bonding portion 42, and a bump 43. The second bonding portion 42 is located opposite to the first bonding portion 41, and is fixed to the semiconductor element 3. The bump 43 is provided between the second bonding portion 42 and an electrode pad 32 of the semiconductor element 3. The bump 43 is formed, for example, by creating a ball-like melted portion at a tip of a wire during a bonding process of the first bonding portion 41, and adhering the ball-like melted portion to the electrode pad 32. After the bump 43 is formed, one end of the wire is bonded to an obverse-surface portion 21 to form the first bonding portion 41, and then the other end of the wire is bonded to the bump 43 to form the second bonding portion 42.

Such an embodiment can also downsize the semiconductor device A6. In addition, provision of the bump 43 can alleviate the impact on the semiconductor element 3 during formation of the second bonding portion 42.

Example of Structure

Figure 21:
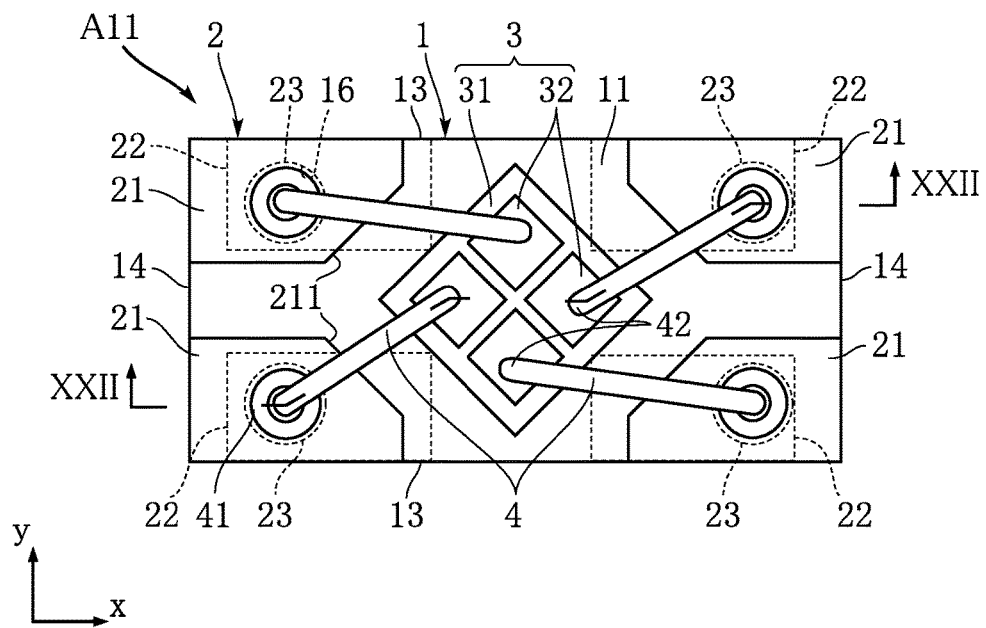
FIG. 21 is a plan view showing an example of the structure of a semiconductor device.
Figure 22:
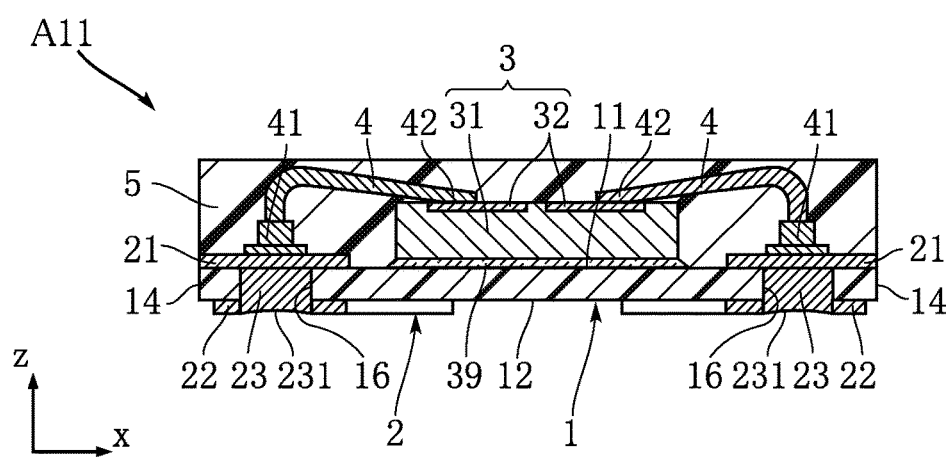
FIG. 22 is a cross-sectional view taken along line XXII-XXII of FIG. 21.

The following describes an example of the structure of a semiconductor device according to the present disclosure, with reference to FIGS. 21 and 22.

FIG. 21 is a plan view showing an example of the structure of the semiconductor device. FIG. 22 is a cross-sectional view taken along line XXII-XXII of FIG. 21.

In a semiconductor device A11 shown in these figures, through-connecting portions 23 of a wiring portion 2 do not have any exposed surfaces 231 as described in the above embodiments. In this regard, the semiconductor device A11 differs from the semiconductor devices A1 to A6.

A base member 1 is provided with four through portions 16. The through portions 16 are through-holes that penetrate the base member 1 in the z direction. The through-connecting portions 23 penetrate the base member 1 and are housed in the through portions 16. The through-connecting portions 23 are away from side surfaces 13 and auxiliary side surfaces 14 of the base member 1 as viewed in the z direction. The positional relationship between the through-connecting portions 23 and first bonding portions 41 of wires 4 is not particularly limited. For example, the through-connecting portions 23 and the first bonding portions 41 may partially overlap with each other as viewed in the z direction, or may not overlap with each other at all. In the illustrated example, the centers of the first bonding portions 41 substantially coincide with the centers of the through-connecting portions 23. Furthermore, although the first bonding portions 41 are encompassed by the through-connecting portions 23 as viewed in the z direction in the illustrated example, the positional relationship therebetween may be reversed.

The present disclosure is not limited to the above embodiments. Various design changes can be made to the specific structures of the elements of the present disclosure.

Unlike the above embodiments, opposite ends of an auxiliary resistor may be in contact with a heat resistor.

The invention claimed is:

1. A semiconductor device comprising:
   a base member having an obverse surface, a reverse surface, and a side surface, the obverse surface and the reverse surface facing away from each other in a thickness direction, the side surface connecting the obverse surface and the reverse surface;
   a wiring portion formed on the base member;
   a semiconductor element arranged on the obverse surface of the base member and electrically connected to the wiring portion; and
   a resin package covering the semiconductor element, wherein
   the wiring portion includes an obverse-surface portion formed on the obverse surface, a reverse-surface portion formed on the reverse surface, and a through portion connecting the obverse-surface portion and the reverse-surface portion,
   the through portion has an exposed surface and a larger portion, the exposed surface being exposed from the side surface of the base member, the larger portion being positioned more inward than the exposed surface as viewed in the thickness direction and having a dimension larger than the exposed surface in a first direction that is perpendicular to the thickness direction and parallel to the exposed surface, the semiconductor device comprises a wire bonded to the semiconductor element and the obverse-surface portion, the semiconductor element is a Hall element, the obverse-surface portion, the reverse-surface portion, and the through portion of the wiring portion are each provided in four in number, the wire is provided in four in number, the side surface of the base member is provided in two in number, the two side surfaces facing away from each other, the exposed surfaces of two of the through portions are exposed from one of the side surfaces, the base member has two auxiliary side surfaces connecting the two side surfaces, and is rectangular as viewed in the thickness direction, and the obverse-surface portions reach the side surfaces and the auxiliary side surfaces as viewed in the thickness direction.

2. The semiconductor device according to claim 1, wherein the exposed surface crosses the base member in the thickness direction.

3. The semiconductor device according to claim 1, wherein the exposed surface is rectangular.

4. The semiconductor device according to claim 1, wherein the exposed surface is flush with the side surface.

5. The semiconductor device according to claim 4, wherein the resin package has a resin side surface flush with the exposed surface.

6. The semiconductor device according to claim 1, wherein the base member has a holder that extends beyond the larger portion as viewed in the thickness direction and that reaches an edge of the exposed surface as viewed in the thickness direction.

7. The semiconductor device according to claim 1, wherein the through portion has a circular arc and a line segment as viewed in the thickness direction, the circular arc having two end points, and the line segment connecting the two end points of the circular arc,
 a part of the circular arc is formed by the larger portion, and a diameter of the circular arc is equal to the dimension of the larger portion, and
 the line segment is formed by the exposed surface.

8. The semiconductor device according to claim 1, wherein the obverse-surface portion is larger than the through portion as viewed in the thickness direction.

9. The semiconductor device according to claim 1, wherein the reverse-surface portion is larger than the through portion as viewed in the thickness direction.

10. The semiconductor device according to claim 1, wherein the reverse-surface portion reaches the side surface as viewed in the thickness direction.

11. The semiconductor device according to claim 1, wherein the wiring portion is not provided between the obverse surface of the base member and the semiconductor element.

12. The semiconductor device according to claim 11, wherein a distance between the obverse surface of the base member and the semiconductor element in the thickness direction is smaller than a thickness of the obverse-surface portion.

13. The semiconductor device according to claim 1, wherein the wire has a bonding portion that is bonded to the obverse-surface portion and that is located at a position retreated from the through portion as viewed in the thickness direction.

14. The semiconductor device according to claim 13, wherein the bonding portion is positioned farther away from the semiconductor element than the through portion is in the first direction.

15. The semiconductor device according to claim 1, wherein the reverse-surface portions reach the side surfaces as viewed in the thickness direction and are retreated from the auxiliary side surfaces as viewed in the thickness direction.

16. A semiconductor device comprising,
 a base member having an obverse surface, a reverse surface, and a side surface, the obverse surface and the reverse surface facing away from each other in a thickness direction, the side surface connecting the obverse surface and the reverse surface;
 a wiring portion formed on the base member;
 a semiconductor element arranged on the obverse surface of the base member and electrically connected to the wiring portion; and
 a resin package covering the semiconductor element, wherein
 the wiring portion includes an obverse-surface portion formed on the obverse surface, a reverse-surface portion formed on the reverse surface, and a through portion connecting the obverse-surface portion and the reverse-surface portion,
 the through portion has an exposed surface and a larger portion, the exposed surface being exposed from the side surface of the base member, the larger portion being positioned more inward than the exposed surface as viewed in the thickness direction and having a dimension larger than the exposed surface in a first direction that is perpendicular to the thickness direction and parallel to the exposed surface,
 the semiconductor device comprises a wire bonded to the semiconductor element and the obverse-surface portion,
 the semiconductor element is a Hall element,
 the obverse-surface portion, the reverse-surface portion, and the through portion of the wiring portion are each provided in four in number,
 the wire is provided in four in number,
 the side surface of the base member is provided in two in number, the two side surfaces facing away from each other,
 the exposed surfaces of two of the through portions are exposed from one of the side surfaces,
 the base member has two auxiliary side surfaces connecting the two side surfaces, and is rectangular as viewed in the thickness direction,
 the Hall element is rectangular as viewed in the thickness direction, and
 the Hall element includes one diagonal line that is parallel to either the side surfaces or the auxiliary side surfaces of the base member.

17. The semiconductor device according to claim 16, wherein the Hall element includes two diagonal lines that are respectively parallel to the side surfaces and the auxiliary side surfaces of the base member.

18. The semiconductor device according to claim 17, wherein the Hall element has four electrode pads.

19. The semiconductor device according to claim 18, wherein two of the electrode pads are parallel to the side surfaces.

20. The semiconductor device according to claim 19, wherein two of the electrode pads are parallel to the auxiliary side surfaces.

21. The semiconductor device according to claim 20, wherein each of the obverse-surface portions has an inclined side that is parallel to a side of the semiconductor element.

22. A semiconductor device comprising:
- a base member including a first surface and a second surface that faces away from the first surface, the first surface including a first edge, a second edge, a third edge, and a fourth edge, the first edge and the second edge being spaced apart from each other in a first direction that is parallel to the first surface, the third edge and the fourth edge being spaced apart from each other in a second direction that is parallel to the first surface and that is different from the first direction;
- a first electrical conductor located on the first surface, the first electrical conductor overlapping with the third edge as viewed in a third direction perpendicular to the first surface;
- a second electrical conductor located on the first surface, the second electrical conductor being spaced apart from the first electrical conductor, the second electrical conductor overlapping with the third edge as viewed in the third direction;
- a third electrical conductor located on the first surface, the third electrical conductor being spaced apart from each of the first electrical conductor and the second electrical conductor, the third electrical conductor overlapping with the fourth edge as viewed in the third direction;
- a fourth electrical conductor located on the first surface, the fourth electrical conductor being spaced apart from each of the first electrical conductor, the second electrical conductor, and the third electrical conductor, the fourth electrical conductor overlapping with the fourth edge as viewed in the third direction;
- a bonding part located on the first surface;
- a Hall element located on the bonding part;
- a first wire including a first end that is bonded to the first electrical conductor and a second end that is bonded to the Hall element;
- a second wire including a first end that is bonded to the second electrical conductor and a second end that is bonded to the Hall element;
- a third wire including a first end that is bonded to the third electrical conductor and a second end that is bonded to the Hall element;
- a fourth wire including a first end that is bonded to the fourth electrical conductor and a second end that is bonded to the Hall element;

wherein, as viewed in the third direction, a distance between the first and second ends of the first wire is smaller than a distance between the first and second ends of the third wire, and as viewed in the third direction, a distance between the first and second ends of the fourth wire is smaller than a distance between the first and second ends of the second wire.

23. The semiconductor device according to claim 22, wherein dimensions of the first, second, third, and fourth electrical conductors in the second direction are smaller than dimensions of the first, second, third, and fourth electrical conductors in the first direction, respectively.

24. The semiconductor device according to claim 22, wherein, as viewed in the third direction, each of the first, second, third, and fourth wire extends in a direction that is different from the first and the second directions.

25. The semiconductor device according to claim 22, wherein, as viewed in the third direction, the first and third wires extend in different directions from each other.

26. The semiconductor device according to claim 24, wherein, as viewed in the third direction, the second and fourth wires extend in different directions from each other.

27. The semiconductor device according to claim 22, wherein the first wire includes a part that is located between the second and third wires as viewed in the third direction.

28. The semiconductor device according to claim 22, wherein each of the second ends of the first, second, third, and fourth wires is located between the first and second electrical conductors in the first direction.

29. The semiconductor device according to claim 22, wherein each of the second ends of the first and fourth wires is located between the first and third electrical conductors in the first direction, and each of the second ends of the second and third wires overlaps with the first and third electrical conductors in the second direction.

30. The semiconductor device according to claim 22, wherein the second end of the first wire is located between the first and second ends of the third wire in the first direction and is located between the second end of the second wire and the second end of the third wire in the second direction, and the second end of the fourth wire is located between the first and second ends of the second wire in the first direction and is located between the second end of the second wire and the second end of the third wire in the second direction.

* * * * *